United States Patent
Saeki

(10) Patent No.: US 9,692,374 B2
(45) Date of Patent: Jun. 27, 2017

(54) DIFFERENTIAL AMPLIFIER CIRCUIT AND DISPLAY DRIVE CIRCUIT

(71) Applicant: Synaptics Japan GK, Tokyo (JP)

(72) Inventor: Yutaka Saeki, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 58 days.

(21) Appl. No.: 14/690,816

(22) Filed: Apr. 20, 2015

(65) Prior Publication Data

US 2015/0310822 A1   Oct. 29, 2015

(30) Foreign Application Priority Data

Apr. 24, 2014  (JP) ................................ 2014-090365

(51) Int. Cl.
*H03F 3/45*  (2006.01)
*G09G 3/36*  (2006.01)

(52) U.S. Cl.
CPC ....... *H03F 3/45179* (2013.01); *G09G 3/3688* (2013.01); *H03F 3/45475* (2013.01); *G09G 2310/0291* (2013.01); *H03F 2200/129* (2013.01); *H03F 2203/45022* (2013.01); *H03F 2203/45032* (2013.01)

(58) Field of Classification Search
CPC ............ H03F 3/45475; H03F 3/45179; H03F 2203/45022; H03F 2203/45032; H03F 2200/129; G09G 3/3688; G09G 2310/0291; G09G 2310/0218; G09G 3/3696; G09G 2300/0809

See application file for complete search history.

(56) References Cited

U.S. PATENT DOCUMENTS

| | | | | |
|---|---|---|---|---|
| 2008/0079492 A1* | 4/2008 | Kobayashi | ............... | H03F 1/26 330/261 |
| 2009/0231319 A1* | 9/2009 | Tsuchi | ................. | G09G 3/3688 345/211 |
| 2011/0141092 A1 | 6/2011 | Kawagoshi | | |

* cited by examiner

*Primary Examiner* — Alexander Eisen
*Assistant Examiner* — Abhishek Sarma
(74) *Attorney, Agent, or Firm* — Patterson + Sheridan, LLP

(57) ABSTRACT

A differential amplifier circuit and display drive circuit having the same are disclosed herein. In one example, a differential amplifier circuit includes a differential pair transistor configure to receive a differential input signal. A current source is connected in series to the differential pair transistor and an output transistor that drives an output terminal on the basis of the differential input signal. The output transistor is configured to increase a current value of a current source on the basis of a timing at which a voltage level of the output terminal is caused to transition. The output transistor is configured to drive the output terminal only during a period in which the output terminal is caused to transition, and thus a slew rate is improved by increasing a bias current of the differential pair transistor in the period.

14 Claims, 12 Drawing Sheets

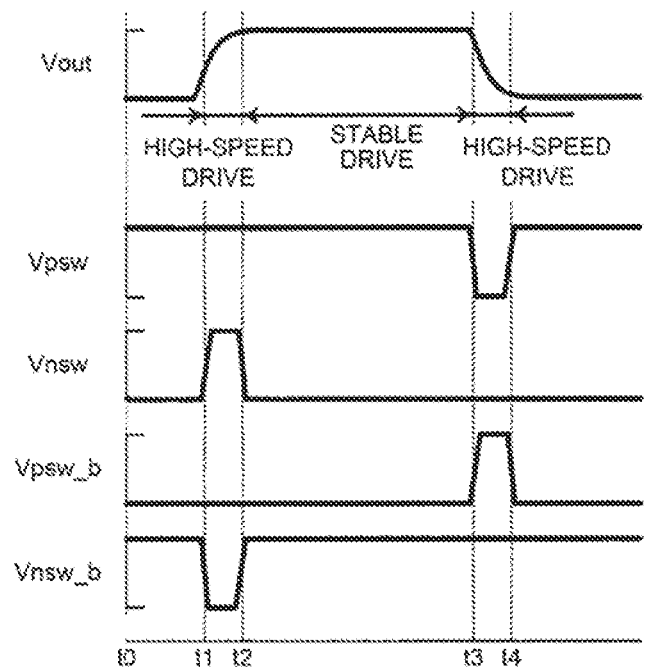

DIFFERENTIAL AMPLIFIER CIRCUIT AND DISPLAY DRIVE CIRCUIT

CROSS-REFERENCE TO RELATED APPLICATIONS

The Present application claims priority from Japanese application JP 2014-090365 filed on Apr. 24, 2014, the content of which is hereby incorporated by reference into this application.

BACKGROUND

The invention relates to a differential amplifier circuit and a display drive circuit using the same, and particularly relates to a technique capable of suitably used in a display drive circuit which is connected to a high-resolution display panel.

A display panel such as a liquid crystal display (LCD) panel includes a plurality of scanning electrodes (also referred to as gate electrodes) and a plurality of signal electrodes (also referred to as source electrodes), and includes display cells having pixel capacitors (liquid crystal capacitors) at intersections thereof. The display resolution corresponds to the number of pixels, and is specified by a product of the number of lines (the number of gate electrodes) and the number of pixels per line (corresponding to the number of source electrodes). In a display drive circuit which is connected to the display panel and drives the source electrodes, loads on the source electrodes increases and the number of source output channels also increases due to an increase in the resolution of the display panel and high definition thereof. Since a display driver integrated circuit (IC) equipped with the display drive circuit is mounted along one side of the display panel, a line length to the pixel capacitor of the display cell located at a distal end increases due to an increase in the number of lines (the number of gate electrodes), and thus line resistance and line capacitance increase. Under such a background, in the display drive circuit, loads on the source electrodes increase due to an increase in the resolution of the display panel and high definition thereof.

JP-A-2011-124782 discloses a differential amplifier circuit which is suitable for a liquid crystal panel drive circuit (source amplifier) of such a liquid crystal display and has a high slew rate. A current which flows through a transistor constituting a differential pair increases only for a period of time shorter than the transition time of a reverse operation of a differential input signal in synchronization with the reverse operation of the differential input signal. The differential amplifier disclosed in JP-A-2011-124782 includes a differential pair transistor to which a differential signal is input and a constant current source which controls a current flowing through the differential pair transistor, and also includes a switch which is connected in parallel to the constant current source and increases a current flowing through the differential pair transistor. During a period in which the switch is turned on, a slew rate of the differential amplifier is improved. Turning-on and turning-off of the switch are controlled by control signals SRN and SRP which are generated from a synchronization signal STB such as a strobe signal indicating display timing. A time interval for improving a slew rate is adjusted depending on pulse widths of the control signals SRN and SRP.

SUMMARY

A differential amplifier circuit and display drive circuit having the same are disclosed herein. In one example, a differential amplifier circuit includes a differential pair transistor configure to receive a differential input signal. A current source is connected in series to the differential pair transistor and an output transistor that drives an output terminal on the basis of the differential input signal. The output transistor is configured to increase a current value of a current source on the basis of a timing at which a voltage level of the output terminal is caused to transition. The output transistor is configured to drive the output terminal only during a period in which the output terminal is caused to transition, and thus a slew rate is improved by increasing a bias current of the differential pair transistor in the period.

In another example, a differential amplifier circuit is provided that includes a differential pair transistor configured to receive a differential input signal. A current source is connected in series to the differential pair transistor. An output transistor is configured to drive an output terminal, wherein the output transistor is constituted by a first P-channel MOS transistor which is connected between a high-potential-side power supply and the output terminal and a first N-channel MOS transistor which is connected between a low-potential-side power supply and the output terminal. The differential pair transistor is constituted by a third P-channel MOS transistor and a third N-channel MOS transistor in which a gate terminal is configured to receive one differential input signal, and a fourth P-channel MOS transistor and a fourth N-channel MOS transistor in which a gate terminal is configured to receive one differential input signal. The current source is configured such that a high-potential-side constant current source that supplies a positive current from the high-potential-side power supply and a second P-channel MOS transistor are connected in parallel to each other, and that a low-potential-side constant current source that supplies a negative current from the low-potential-side power supply and a second N-channel MOS transistor are connected in parallel to each other, supplies the positive current from the high-potential-side power supply to source terminals of the third P-channel MOS transistor and the fourth P-channel MOS transistor, and supplies the negative current from the negative-potential-side power supply to source terminals of the third P-channel MOS transistor and the fourth P-channel MOS transistor. The positive current which is supplied from the high-potential-side power supply is increased by controlling a gate terminal of the second P-channel MOS transistor using a signal which is input to a gate terminal of the first P-channel MOS transistor, and an absolute value of the negative current which is supplied from the low-potential-side power supply is increased by controlling a gate terminal of the second N-channel MOS transistor using a signal which is input to a gate terminal of the first N-channel MOS transistor.

In another example, a display drive circuit is provided that includes a voltage follower amplifier which is constituted by at least one of the differential amplifier circuits described above, as a source amplifier configured to drive a source electrode of a display panel.

BRIEF DESCRIPTION OF THE DRAWINGS

FIG. 15 is a timing diagram illustrating an operation example of the differential amplifier circuit shown in FIG. 14.

DETAILED DESCRIPTION

1. Overview

Figure 1:
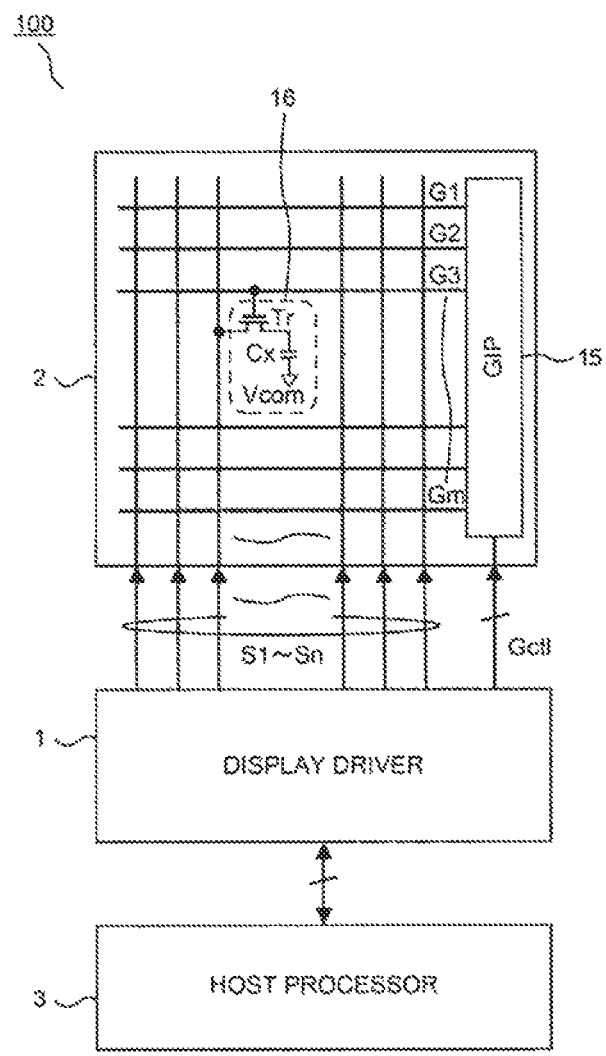
FIG. 1 is a block diagram illustrating a configuration example of an electronic apparatus including a display drive circuit in which a differential amplifier circuit according to the invention is mounted as a source amplifier.

The inventor has examined JP-A-2011-124782, and then has become aware of the following new problem.

The differential amplifier disclosed in JP-A-2011-124782 requires a timing control signal in order to improve a slew rate. In a liquid crystal display, a strobe signal indicating display timing is used, but there is no guarantee that such a control signal is present in other devices. In addition, since a pulse width of a control signal for turning on the switch which increases a current flowing through the differential pair transistor, that is, a time interval for improving a slew rate is specified by design of a control signal generation circuit, it cannot be said that an appropriate pulse width corresponding to a transition level of a differential input signal is necessarily obtained in case that the display panel is actually connected. This is because the transition level of the differential input signal changes depending on displayed data, and only one kind of display panel is not connected. For this reason, in case that a pulse width of a control signal for turning on the switch which increases a current flowing through the differential pair transistor is shorter than an appropriate pulse width, a slew rate cannot be sufficiently improved, and in case that a pulse width is longer than the appropriate pulse width, power is consumed more than necessary.

An object of the invention is to appropriately control a timing at which a slew rate is improved in accordance with the transition of an output signal, in a differential amplifier circuit capable of temporarily improving the slew rate.

Methods and apparatus for solving such a problem will be described below, but other problems and novel features will be apparent from the following description and accompanying drawings of the specification.

According to an embodiment, the following configuration is formed.

That is, a differential amplifier circuit according to an embodiment of the invention includes a differential pair transistor to which a differential input signal is supplied, a bias current source which is connected in series to the differential pair transistor, and an output transistor that drives an output terminal on the basis of the differential input signal. The output transistor increases a current value of a bias current source on the basis of a timing at which a voltage level of the output terminal is caused to transition. The output transistor drives the output terminal only in a period in which the output terminal is caused to transition, and thus a slew rate is improved by increasing a bias current of the differential pair transistor in the period.

A brief description of an effect obtained by the embodiment is as follows.

That is, it is possible to appropriately control a timing at which a slew rate is improved in accordance with the transition of an output signal, in a differential amplifier circuit capable of temporarily improving the slew rate.

2. Summary of the Embodiments

First, summary of representative embodiments of the invention disclosed in the application will be described. Reference numerals in drawings in parentheses referred to in description of the summary of the representative embodiments just denote components included in the concept of the components to which the reference numerals are designated.

[1] <Improvement in Slew Rate Based on Self-Control>

According to a representative embodiment disclosed in the present application, there is provided a differential amplifier circuit (4) including a differential pair transistor (MP2, MP3, MN2, MN3) to which a differential input signal is supplied, a current source (MP1, MP20, MN1, MN20) which is connected in series to the differential pair transistor, and an output transistor (MP10, MN10) that drives an output terminal (Vout) on the basis of the differential input signal. The output transistor increases an absolute value of a current value of the current source on the basis of a timing at which a voltage level of the output terminal is caused to transition.

Thereby, it is possible to appropriately control a timing at which a slew rate is improved in accordance with the transition of the output voltage (Vout), in the differential amplifier circuit capable of temporarily improving the slew rate.

[2] <Circuit Based on MOS Transistor>

In item 1, the output transistor is a first MOS transistor (MP10, MN10), the current source is configured by connecting a constant current source (MP1, MN1) and a second MOS transistor (MP20, MN20) in parallel, and the absolute value of the current value of the current source is increased by controlling a gate terminal of the second MOS transistor using a signal (Vpon, Vnon) which is input to a gate terminal of the first MOS transistor.

Thereby, it is possible to increase a bias current of the differential pair transistor, at the same timing as that of a charge and discharge current for the output transistor to charge and discharge a load and with the magnitude substantially proportional thereto, and to appropriately control not only a timing at which the slew rate is improved but also the magnitude thereof, in accordance with the transition of the output voltage (Vout).

[3] <Cutoff Switch of Additional Current Source>

In item 1, the output transistor is a first MOS transistor (MP10, MN10), the current source is constituted by a constant current source (MP1, MN1), and a switch (SW1, SW2) and a second MOS transistor (MP20, MN20) which are connected in parallel to the constant current source and are connected in series to each other, and the absolute value of the current value of the current source is increased by controlling a gate terminal of the second MOS transistor using a signal (Vpon, Vnon) which is input to a gate terminal of the first MOS transistor.

Thereby, the same operational effect as in item 2 is exhibited. Further, the switches (SW1, SW2) are turned off during a period in which the slew rate is not required to be improved, and thus it is possible to suppress the leakage of a current in the differential pair transistor (MP2, MP3, MN2, MN3) based on the second MOS transistor (MP20, MN20).

[4] <Self-control of Cutoff Switch of Additional Current Source>

In item 3, the switch set to an off state (i.e., turned off) in response to the basis of the signal (Vpon, Vnon) which is input to the gate terminal of the first MOS transistor.

Thereby, a timing signal for detecting the stabilization of the output voltage (Vout) from the output terminal is generated from the internal signal (Vpon, Vnon) of the differential amplifier circuit, and the on/off state of the switch is controlled using this timing signal, thereby allowing the second MOS transistor (MP20, MN20) which is an additional current source to be turned off at an appropriate timing.

[5] <Display Drive Circuit>

According to a representative embodiment disclosed in the present application, there is provided a display drive circuit (1) including a voltage follower amplifier which is constituted by the differential amplifier circuit (4) according to any one of items 1 to 4, as a source amplifier circuit (4_1 to 4_n) that drives a source electrode of a display panel to be connected.

Thereby, it is possible to provide a display drive circuit capable of controlling a period in which a slew rate is improved autonomously and appropriately, in accordance with the magnitude of a load of the source electrode of the display panel to be connected.

[6] <Display Driver IC>

In item 5, the display drive circuit is formed on a single semiconductor substrate.

Thereby, it is possible to provide a display driver IC capable of being adapted to a wide-range display panel with one product, without developing another kind of display driver IC obtained by optimizing a slew rate for each display panel to be connected, or providing a display driver IC that adjusts a slew rate of the source amplifier for each display panel to be connected.

[7] <Differential Amplifier Circuit of Rail to Rail>

According to a representative embodiment disclosed in the present application, there is provided a differential amplifier circuit (4) including a differential pair transistor (MP2, MP3, MN2, MN3) to which a differential input signal is supplied, a current source (MP1, MP20, MN1, MN20) which is connected in series to the differential pair transistor, and an output transistor (MP10, MN10) that drives an output terminal (Vout), and the circuit is configured as follows.

The output transistor is constituted by a first P-channel MOS transistor (MP10) which is connected between a high-potential-side power supply (for example, VDD) and the output terminal and a first N-channel MOS transistor (MN10) which is connected between a low-potential-side power supply (for example, GND) and the output terminal.

The differential pair transistor is constituted by a third P-channel MOS transistor (MP2) and a third N-channel MOS transistor (MN2) in which one differential input signal is input to a gate terminal, and a fourth P-channel MOS transistor (MP3) and a fourth N-channel MOS transistor (MN3) in which the other differential input signal is input to a gate terminal.

The current source is configured such that a high-potential-side constant current source (MP1) that supplies a positive current from the high-potential-side power supply and a second P-channel MOS transistor (MP20) are connected in parallel to each other, and that a low-potential-side constant current source (MN1) that supplies a negative current from the low-potential-side power supply and a second N-channel MOS transistor (MN20) are connected in parallel to each other. The positive current is supplied from the high-potential-side power supply to source terminals of the third P-channel MOS transistor and the fourth P-channel MOS transistor, and the negative current is supplied from the negative-potential-side power supply to source terminals of the third P-channel MOS transistor and the fourth P-channel MOS transistor.

The positive current which is supplied from the high-potential-side power supply is increased by controlling a gate terminal of the second P-channel MOS transistor (MP20) using a signal (Vpon) which is input to a gate terminal of the first P-channel MOS transistor, and an absolute value of the negative current which is supplied from the low-potential-side power supply is increased by controlling a gate terminal of the second N-channel MOS transistor (MN20) using a signal (Vnon) which is input to a gate terminal of the first N-channel MOS transistor.

Thereby, in a differential amplifier circuit in which the output voltage (Vout) is full-swung in a so-called rail to rail manner between the high-potential-side power supply and the low-potential-side power supply, it is possible to improve a slew rate at an appropriate timing according to the transition of the output voltage (Vout).

[8] <Feedback Amount of Additional Current Source>

In item 7, a trans-conductance ratio (N) between the first P-channel MOS transistor (MP10) and the second P-channel MOS transistor (MP20) and a trans-conductance ratio (N) between the first N-channel MOS transistor (MN10) and the second N-channel MOS transistor (MN20) are equal to each other.

Thereby, the amount of a bias current for improving a slew rate is balanced in the rise and fall of an output. The amount of feedback to an additional current source is specified by the ratio. Here, the term "equal" as used herein does not require mathematically strict equality, and means that a design is performed so as to become substantially the same ratio in a range inclusive of an error which is permitted industrially (the same is true of the present application).

[9] <N×W/L>

In item 8, gate lengths of the first P-channel MOS transistor (MP10) and the second P-channel MOS transistor (MP20), and gate lengths of the first N-channel MOS transistor (MN10) and the second N-channel MOS transistor (MN20) are respectively equal to each other, and a ratio between gate widths of the first P-channel MOS transistor (MP10) and the second P-channel MOS transistor (MP20), and a ratio between gate widths of the first N-channel MOS transistor (MN10) and the second N-channel MOS transistor (MN20) are respectively equal to the trans-conductance ratios (N).

Thereby, the amount of feedback to an additional current source is specified by the transistor size.

[10] <Cutoff Switch of Additional Current Source>

In item 7, a first switch (SW1) which is inserted in series into the second P-channel MOS transistor (MP20) and a second switch (SW2) which is inserted in series into the second N-channel MOS transistor (MN20) are further included.

Thereby, the same operational effect as in item 7 is exhibited. Further, the first and second switches (SW1, SW2) are set in an off state during a period in which the slew rate is not required to be improved, and thus it is possible to suppress the leakage of a current in the differential pair transistor (MP2, MP3, MN2, MN3) based on the second P-channel MOS transistor (MP20) and the second N-channel MOS transistor (MN20).

[11] <Self-Control of Cutoff Switch of Additional Current Source>

In item 10, control for cutting off the first switch and the second switch is performed on the basis of the signal (Vpon, Vnon) which is input to each of the gate terminals of the first P-channel MOS transistor and the first N-channel MOS transistor.

Thereby, a timing signal for detecting the stabilization of the output voltage (Vout) from the output terminal is generated from the internal signal (Vpon, Vnon) of the differential amplifier circuit, and the on/off state of the switch is controlled using this timing signal, thereby allowing the second P-channel MOS transistor (MP20) and the second N-channel MOS transistor (MN20) which are additional current sources to be turned off at an appropriate timing.

[12] <Control Circuit of Cutoff Switch of Additional Current Source>

In item 10, a switch control circuit (comparator) that turns on the second switch in a transition period in which an output from the output terminal rises, and turns on the first switch in a transition period in which the output from the output terminal falls is further included.

Thereby, similarly to item 11, it is possible to turn off the second P-channel MOS transistor and the second N-channel MOS transistor which are additional current sources at an appropriate timing.

[13] <Switch Control Circuit Based on Comparator>

In item 12, the switch control circuit includes a fifth P-channel MOS transistor (MP11) which is connected between the high-potential-side power supply and a fall detection node (Vpsw), a fifth N-channel MOS transistor (MN11) which is connected between the low-potential-side power supply and the fall detection node (Vpsw), a sixth P-channel MOS transistor (MP12) which is connected between the high-potential-side power supply and a rise detection node (Vnsw), and a sixth N-channel MOS transistor (MN12) which is connected between the low-potential-side power supply and the rise detection node (Vnsw).

A trans-conductance ratio between the fifth P-channel MOS transistor and the fifth N-channel MOS transistor is larger than a trans-conductance ratio between the first P-channel MOS transistor and the first N-channel MOS transistor.

A trans-conductance ratio between the sixth P-channel MOS transistor and the sixth N-channel MOS transistor is smaller than a trans-conductance ratio between the first P-channel MOS transistor and the first N-channel MOS transistor.

Thereby, a switch control circuit (comparator) for cutting off the switch which is an additional current source using self-control can be configured by a simple circuit. With an offset appropriate to two comparators constituting the switch control circuit, a fall period of the output voltage (Vout) can be detected in one comparator, and a rise period of the output voltage (Vout) can be detected in the other comparator. That is, since a comparator which is constituted by the fifth P-channel MOS transistor (MP11) and the fifth N-channel MOS transistor (MN11) has an offset for the output transistor, a high signal is output in the rise period and stable period of the output voltage (Vout), and a low signal is output in the fall period. Therefore, the first switch (SW1) is turned on to increase the bias current of the differential stage on the P-channel side, and thus the slew rate of fall is improved. Since a comparator which is constituted by the sixth P-channel MOS transistor (MP12) and the sixth N-channel MOS transistor (MN12) has a reverse offset for the output transistor, a low signal is output in the fall period and stable period of the output voltage (Vout), and a high signal is output in the fall period. Therefore, the second switch (SW2) is turned on to increase the bias current of the differential stage on the N-channel side, and thus the slew rate of rise is improved.

[14] <Display Drive Circuit>

According to a representative embodiment disclosed in the present application, there is provided a display drive circuit (1) including a voltage follower amplifier which is constituted by the differential amplifier circuit according to anyone of items 7 to 13, as a source amplifier circuit (4_1 to 4_n) that drives a source electrode of a display panel to be connected.

Thereby, similarly to item 5, it is possible to provide the display drive circuit (1) capable of autonomously and appropriately controlling a period in which the slew rate is improved, in accordance with the magnitude of a load of the source electrode of the display panel (2) to be connected.

[15] <Display Driver IC>

In item 14, the display drive circuit is formed on a single semiconductor substrate.

Thereby, similarly to item 6, it is possible to provide a display driver IC capable of being adapted to a wide-range display panel with one product, without developing another kind of display driver circuit (1) obtained by optimizing a slew rate for each display panel (2) to be connected, or providing a display driver IC that adjusts a slew rate of the source amplifier for each display panel to be connected.

3. Further Detailed Description of the Embodiments

A further detailed description of the embodiments will be given below.

First Embodiment

FIG. 1 is a block diagram illustrating a configuration example of an electronic apparatus 100 including a display drive circuit (display driver IC) 1 in which a differential amplifier circuit according to the invention is mounted as a source amplifier. The electronic apparatus 100 is an example of an electronic apparatus according to the invention, constitutes a portion of a portable terminal such as, for example, a PDA (Personal Digital Assistant) or a cellular phone, and includes a display panel 2, a display drive circuit (display driver IC) 1 and a host processor 3. In the electronic apparatus 100, image data which is supplied from the host processor 3 is displayed on the display panel 2 by the display drive circuit (display driver IC) 1.

The electronic apparatus 100 may be configured to further include a touch panel, a touch panel controller, a sub-processor for touch detection, and the like which are not shown in the drawing. In this case, the display drive circuit 1 and the touch panel controller, or the sub-processor and the host processor 3 may be formed on a single semiconductor chip, or be mounted in one package, for example, as a multi-chip module to thereby be formed as one semiconductor device. In addition, the display panel 2 and the touch panel may be mounted so as to be superimposed on each other, and may have an in-cell configuration in which these panels are manufactured integrally with each other, or an on-cell configuration in which these panels are manufactured individually and superimposed on each other. The host processor 3 generates image data, and the display drive circuit 1 performs display control for displaying the image data which is received from the host processor 3 on the display panel 2. In addition, the host processor 3 may be configured to acquire data of position coordinates incase that a contact event (touch) is generated, from the sub-processor, and to analyze an input based on the operation of the touch panel from a relationship between the data of position coordinates in the display panel 2 and a screen displayed by giving the data to the display drive circuit 1. Further, a communication control unit, an image processing unit, an audio processing unit, other accelerators, and the like are built into the host processor 3 or connected thereto, and thus the electronic apparatus 100 is configured as, for example, a portable terminal.

The display panel 2 is configured such that gate wirings G1 to Gm as scanning electrodes formed in a transverse direction and source wirings S1 to Sn as signal electrodes formed in a longitudinal direction are disposed, and that display cells 16 are disposed at the respective intersection portions thereof. As illustrated in a region which is surrounded by a broken line in the drawing, each of the display cells 16 is constituted by a transfer gate Tr of which the gate terminal is connected to a gate wiring and of which the source terminal is connected to a source wiring, and a pixel capacitor Cx such as, for example, a liquid crystal which is formed between the drain terminal of the transfer gate Tr and a common voltage Vcom. The structures of the transfer gates Tr are symmetric with respect to each other, and the relationship between the drain terminal and the source terminal described above may be reversed. The gate wirings G1 to Gm which are scanning electrodes are scanned and driven by a gate drive circuit 15 which is formed in the display panel 2. A circuit constituting the gate drive circuit 15 is configured using, for example, thin film transistors (TFT) which are formed on a glass substrate of the display panel 2. In this case, the gate drive circuit 15 is called a gate in panel (GIP). A signal Gctl for controlling the gate drive circuit (GIP) 15 is supplied from the display drive circuit 1. For example, in case that the gate drive circuit (GIP) 15 is constituted by shift registers, the supplied signal Gctl includes a clock or a start flag for a shift operation, a signal for enabling/disabling a shift direction or a shift operation, and the like. A signal having a gradation level corresponding to luminance to be displayed is applied to the source wirings S1 to Sn as signal electrodes from the display drive circuit 1 directly or through a demultiplexer, and the pixel capacitors Cx of lines selected by the scanning electrodes are charged in parallel. In case that the display panel 2 is a liquid crystal display panel, the magnitude of polarization of a liquid crystal is determined depending on the magnitude of an electric field which is formed by charge held by the pixel capacitor Cx, and the amount of light transmission, that is, the luminance of the pixel is determined. Until the same line is selected in the next frame and charging at a new display level is performed, the pixel capacitor Cx holds charge and displays the same luminance. Drive of the scanning electrode and the signal electrode as described above in order to transfer charge corresponding to a display level to the pixel capacitor Cx is called display drive, and a display drive period (also referred to as a display period for short) means a period in which the display drive is performed. The configuration of the display panel 2 is arbitrary without being limited to the shown example. For example, instead of including the gate drive circuit 15, the gate wirings G1 to Gm can also be configured to be directly driven by the display drive circuit (display driver IC) 1 or a gate driver IC of a separate chip.

Figure 2:
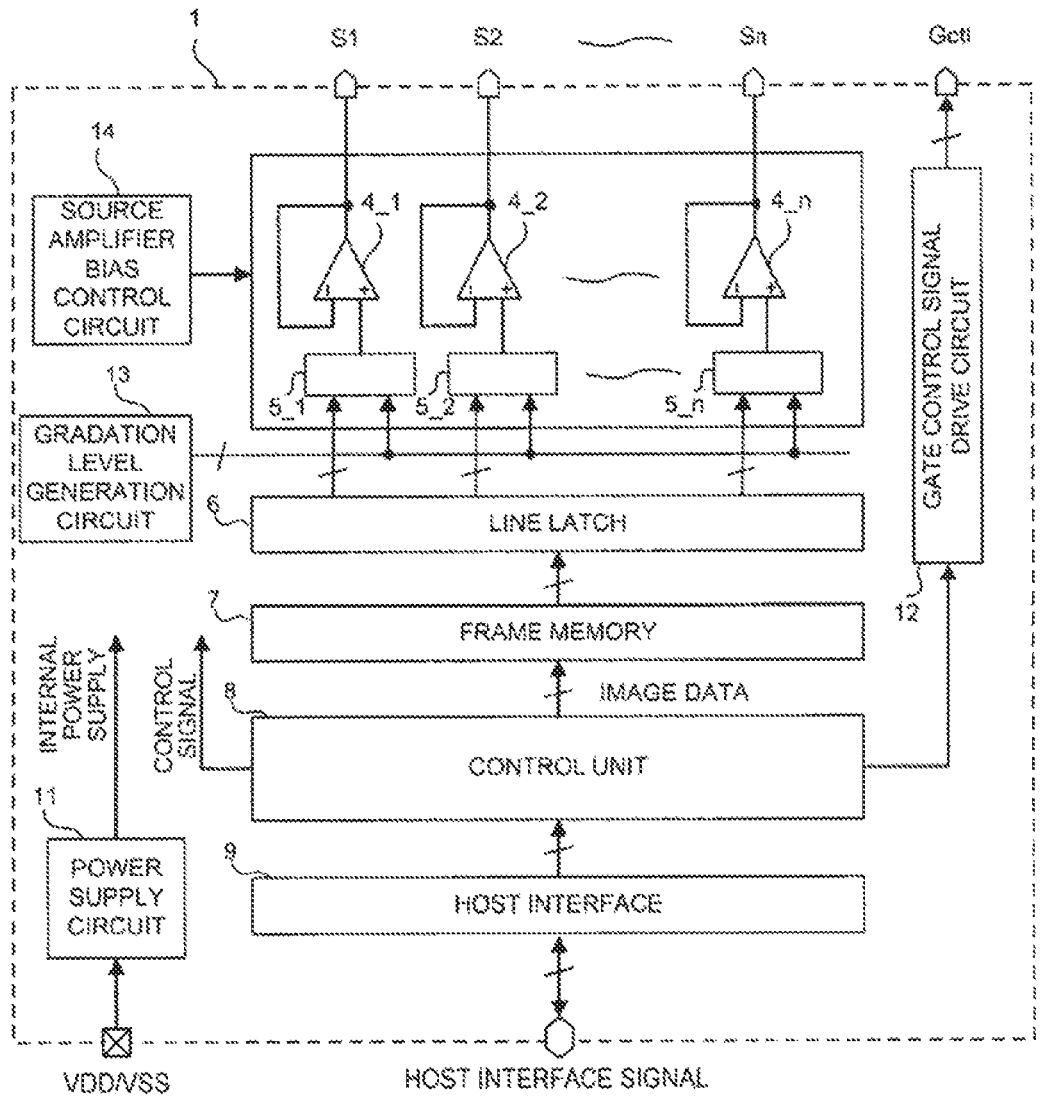
FIG. 2 is a block diagram illustrating a configuration example of the display drive circuit (display driver IC).

FIG. 2 is a block diagram illustrating a configuration example of the display drive circuit (display driver IC) 1. The display drive circuit 1 is configured to include a host interface 9, a control unit 8, a frame memory 7, a line latch 6, source amplifier circuits 4_1 to 4_n, gradation level selection circuits 5_1 to 5_n, a source amplifier bias control circuit 14, a gradation level generation circuit 13, a gate control signal drive circuit 12, and a power supply circuit 11. The differential amplifier circuit according to the invention is applied to the source amplifier circuits 4_1 to 4_n.

The display drive circuit 1 is connected to the host processor 3 through the host interface 9, receives a control command, transmits and receives various parameters, further receives image data to be displayed on the display panel 2 at high speed, and receives timing information such as a vertical synchronizing signal (Vsync) and a horizontal synchronizing signal (Hsync) along therewith. The host interface 9 may be, for example, an interface based on MIPI-DSI (Mobile Industry Processor Interface Display Serial Interface) which is one of standard communication interfaces of a display device. The control unit 8 includes a command register (not shown) and a parameter register (not shown) that hold the control command and the parameters which are received from the host processor 3, and controls the operation of each circuit on the basis thereof, for example, an operation for outputting the control signal Gctl of the gate drive circuit 15 from the gate control signal drive circuit 12. The control unit 8 writes the image data which is received from the host processor 3 in the frame memory 7 through the host interface 9. The frame memory 7 is constituted by, for example, a SRAM (Static Random Access Memory). One line's worth of image data is read out into the line latch 6 from the frame memory 7, and the line latch 6 supplies one line's worth of image data, in parallel, to the gradation level selection circuits 5_1 to 5_n. A multi-gradation analog gradation voltage is supplied to the gradation level selection circuits 5_1 to 5_n from the gradation level generation circuit 13. Each of the gradation level selection circuits 5_1 to 5_n selects one gradation level, corresponding to the image data which is input from the line latch 6, from the supplied multi-gradation analog gradation voltage, or selects a plurality of gradation levels to generate an intermediate gradation level from these levels, and supplies the generated gradation level to the source amplifier circuits 4_1 to 4_n to be connected thereto. As illustrated in FIG. 2, the source amplifier circuits 4_1 to 4_n are voltage follower amplifiers which are constituted by the differential amplifier circuits, and are configured to perform current amplification on the supplied gradation level, and to drive the source wirings S1 to Sn which are signal electrodes of the display panel 2 to be connected thereto. A bias voltage is supplied to the source amplifier circuits 4_1 to 4_n from the source amplifier bias control circuit 14.

The power supply circuit 11 is configured to include a booster circuit, a step-down circuit, a stabilizing circuit (regulator) and the like, and generates and supplies an internal power supply, used in each circuit within the display drive circuit (display driver IC) 1, from power supplies VDD/VSS supplied from the outside.

The above-mentioned display drive circuit (display driver IC) 1 has been described with reference to a configuration example in which the frame memory 7 is built in, but can also adopt a configuration in which the frame memory is not built in. In the configuration example in which the frame memory 7 is built in, in case that an image to be displayed is a still image, a still image of one frame is held in the frame memory 7, and is repeatedly read out and displayed, whereby it is possible to omit the transfer of image data from the host processor 3 in a period in which the still image is displayed. On the other hand, in the configuration in which the frame memory is not built in, a chip area can be reduced, and thus costs are reduced.

Figure 3:
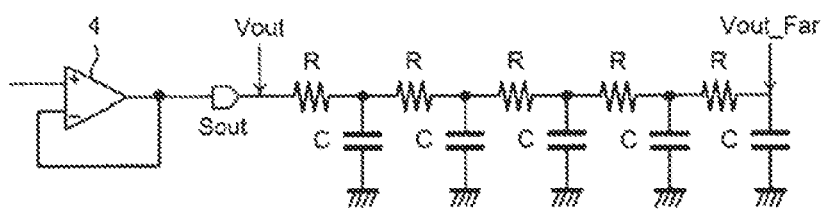
FIG. 3 is a diagram schematically illustrating an equivalent circuit of a load based on a display panel of the source amplifier.

FIG. 3 is a diagram schematically illustrating an equivalent circuit of a load based on the display panel 2 of the source amplifier circuit 4. The output of the source amplifier circuit 4 is connected to a source wiring through a terminal Sout. The display cell 16 having the same number as the number of lines as described above is connected to the source wiring. The equivalent circuit of the load of the source amplifier circuit 4 is a distributed constant circuit based on wiring resistors R of the source wiring and parasitic capacitors C such as a wiring capacitor. However, a lumped constant circuit is shown in FIG. 3. In addition, in the display cell 16 of a line selected by the gate wiring, the pixel capacitor Cx is included in the parasitic capacitor C of the load. However, in a non-selection line, only a diffusion layer capacitor and the like in case that the transfer gate Tr is turned off are included in the parasitic capacitor C of the load, and the pixel capacitor Cx is not included therein. A voltage Vout in the output terminal of the source amplifier circuit 4 is attenuated by the shown equivalent circuit and thus is changed to Vout_Far at the far end. Since Vout_Far is delayed by the resistor R and the capacitor C with respect to Vout, it is expected to offset this delay by increasing the slew rate of the source amplifier circuit 4.

Figure 4:
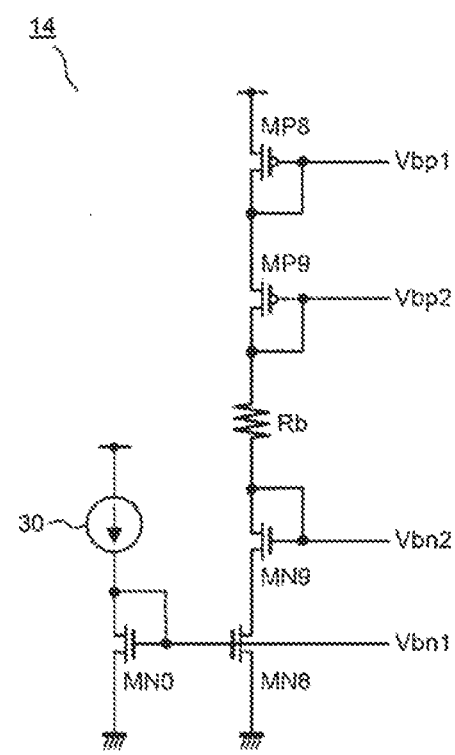
FIG. 4 is a circuit diagram illustrating a configuration example of a source amplifier bias control circuit.
Figure 5:
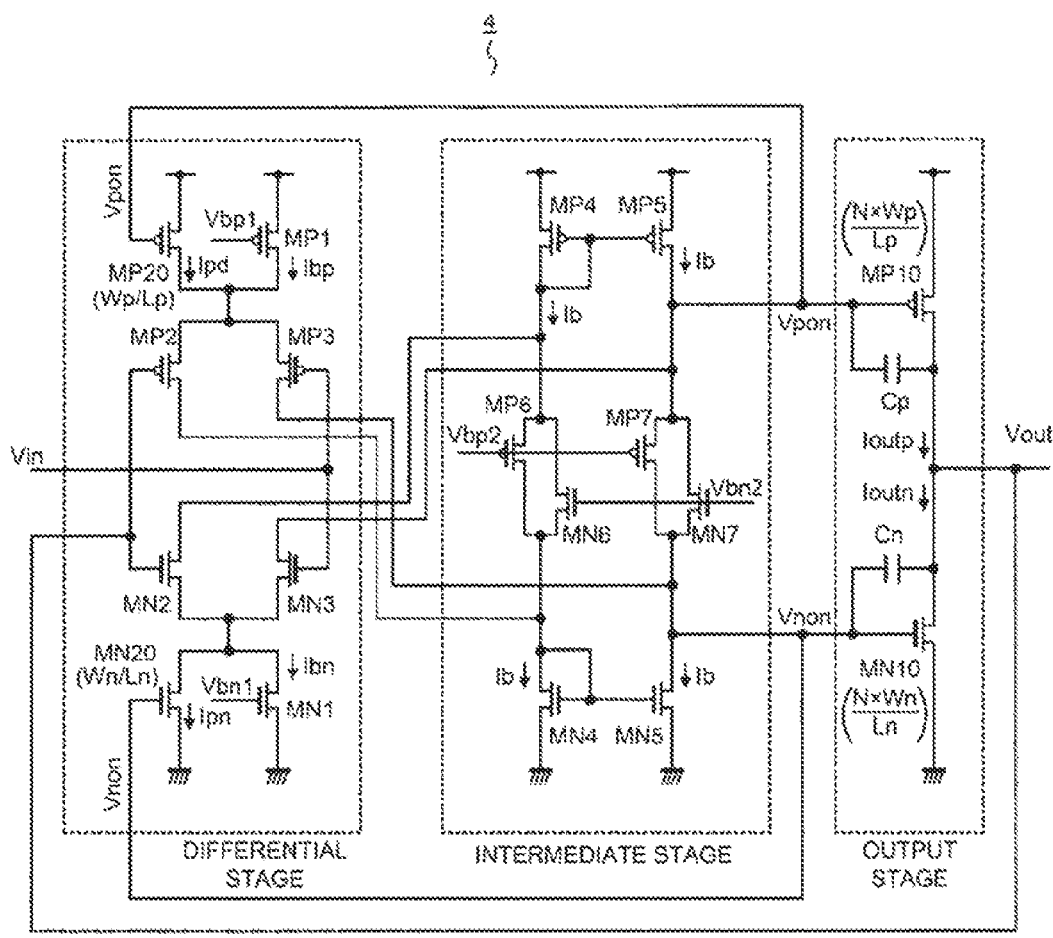
FIG. 5 is a circuit diagram illustrating a configuration example of the source amplifier of the differential amplifier circuit according to the invention.

FIG. 5 is a circuit diagram illustrating a configuration example of the source amplifier circuit 4 based on the differential amplifier circuit according to the invention, and FIG. 4 is a circuit diagram illustrating a configuration example of the source amplifier bias control circuit 14 that supplies a bias to the source amplifier circuits 4_1 to 4_n. Normally, a plurality of source amplifier circuit 4_1 to 4_n are mounted in the display drive circuit 1, but sign "4" is used in case that the one is referred to. The source amplifier bias control circuit 14 can supply a bias common to a plurality of source amplifier circuits 4_1 to 4_n. The source amplifier bias control circuit 14 is constituted by a current source 30, three N-channel MOS transistors MN0, MN8, and MN9, two P-channel MOS transistors MP8 and MP9, and a resistor Rb. A current mirror is constituted by MN0 and MN8, a current value which is specified by the current source 30 is amplified according to a ratio between the sizes (trans-conductance) of MN0 and MN8, and a current flows to MN8, MN9, MP8, and MP9, and the resistor Rb. MN8, MN9, MP8, and MP9 constitute current mirrors by MOS transistors of a differential stage and an intermediate stage of the source amplifier circuit 4 described later, and control each bias current through bias control lines Vbp1, Vbp2, Vbn2, and Vbn1.

FIG. 5 is a circuit diagram illustrating a configuration example of the source amplifier circuit 4. The source amplifier circuit 4 is a differential amplifier (operational amplifier) which is composed of the differential stage, the intermediate stage, and an output stage, and the output Vout is fed back to one differential input, to form a voltage follower amplifier. The differential stage is configured to include three P-channel MOS transistors MP1 to MP3 and three N-channel MOS transistors MN1 to MN3. The bias control lines Vbp1 and Vbn1 are respectively connected to MP1 and MN1. A current mirror is formed between MP8 and NN8 of the source amplifier bias control circuit 14, and functions as a tail current source that provides bias currents Ibp and Ibn to the differential stage of the source amplifier circuit 4. In the invention, a P-channel MOS transistor MP20 and an N-channel MOS transistor MN20 are respectively added in parallel to MP1 and MN1, but such a configuration and operation will be described below in detail. A feedback from Vout is connected to the gate terminals of MP2 and MN2, and Vin which is the other input is input to the gate terminals of MP3 and MN3. The intermediate stage is constituted by four P-channel MOS transistors MP4 to MP7 and four N-channel MOS transistors MN4 to MN7. Two current paths of a current path constituted by MP4, MP6, MN6, and MN4 and a current path constituted by MP5, MP7, MN7, and MN5 are respectively configured to cause currents Ib having the same value to flow. A differential voltage is generated by a current flowing in from the differential stage and a current flowing out to the differential stage in accordance with the difference between two inputs Vin and Vout to the differential stage, and is output to the output stage as Vpon and Vnon. The bias control lines Vbp2 and Vbn2 are input to the gate terminals of MP6 and MP7, and MN6 and MN7, respectively, from the source amplifier bias control circuit 14, a current mirror is formed between MP9 and NN9 of the source amplifier bias control circuit 14, and thus MP6 and MN6, and MP7 and MN7 are respectively configured to function as resistive loads. The output stage is constituted by one P-channel MOS transistor MP10 in which Vpon is input to the gate terminal, one N-channel MOS transistor MN10 in which Vnon is input to the gate terminal, and feedback capacitors Cp and Cn which are connected between each of the drain terminals and the gate terminals. Current amplification is performed on the differential voltage which is input from the intermediate stage, and Vout is output.

In the invention, MP20 functioning as a varying bias source is added in parallel to the P-channel MOS transistor MP1 of the differential stage, and the gate voltage Vpon of the output stage is fed back to the gate terminal. In addition, MN20 functioning as a varying bias source is added in parallel to the N-channel MOS transistor MN1, and the gate voltage Vnon of the output stage is fed back to the gate terminal. The ratio between the gate width/gate length of MP20 is set to Wp/Lp, the ratio between the gate width/gate length of the output transistor MP10 is set to N×Wp/Lp, the ratio between the gate width/gate length of MN20 is set to Wn/Ln, the ratio between the gate width/gate length of the output transistor MN10 is set to N×Wn/Ln, and the trans-conductance of MP20 and MN20 functioning as varying bias sources is set to 1/N of the output transistors MP10 and MN10.

The bias currents Ibp and Ibn normally flow to the input transistors MP2 and MP3 and the input transistors MN2 and MN3 of the differential stage, respectively. However, in case that the varying bias sources MP20 and MN20 are turned on, varying biases Ipd and Ind are respectively added thereto. Thereby, it is possible to operate the source amplifier circuit 4 at high speed by improving a slew rate in a period in which the varying bias sources MP20 and MN20 are turned on.

Figure 6:
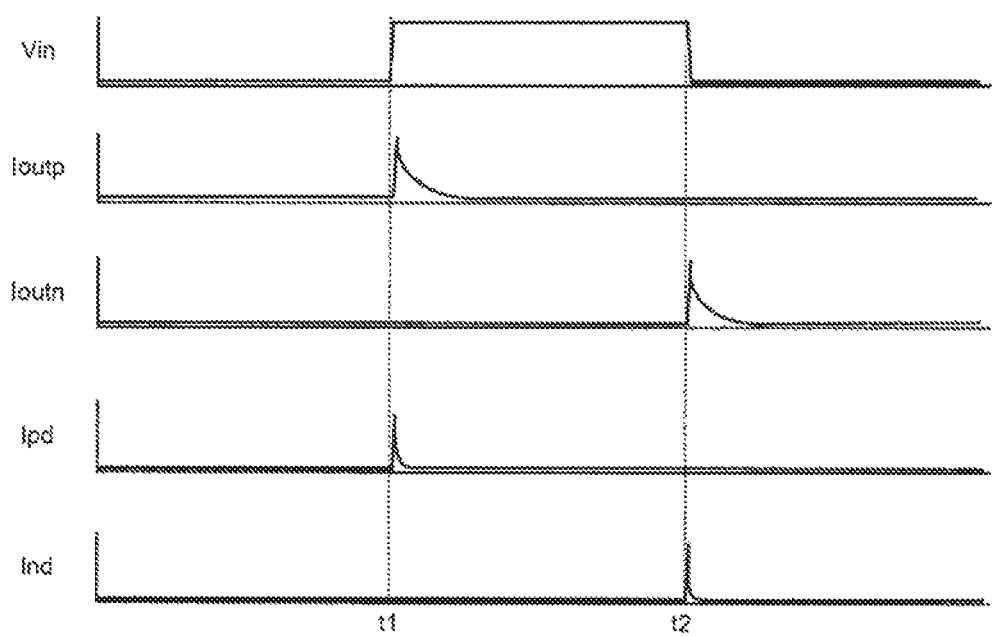
FIG. 6 is a waveform diagram illustrating an operation example of the differential amplifier circuit (source amplifier) shown in FIG. 5.
Figure 7:
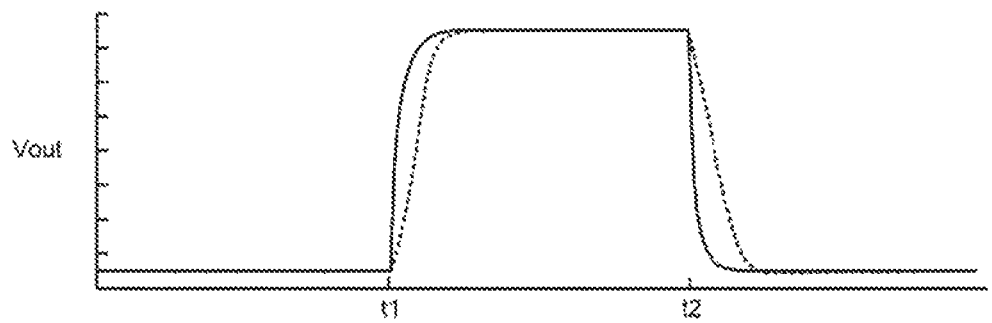
FIG. 7 is a waveform diagram illustrating an output signal (Vout) of the differential amplifier circuit (source amplifier) shown in FIG. 5.
Figure 8:
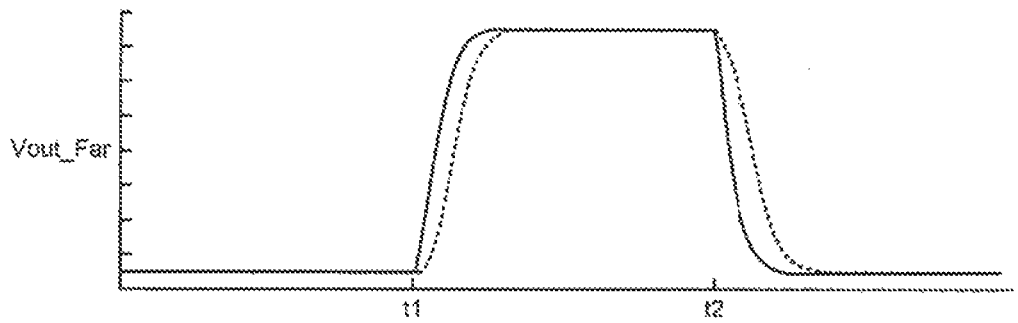
FIG. 8 is a waveform diagram illustrating a signal (Vout_Far) at the far end of the display panel which is driven by the differential amplifier circuit (source amplifier) shown in FIG. 5.

The operation of the source amplifier circuit 4 will be described in more detail. FIG. 6 is a waveform diagram illustrating an operation example of the differential amplifier circuit (source amplifier circuit 4) shown in FIG. 5. The horizontal axis is the time, and the vertical axis direction represents the input voltage Vin, the currents Ioutp and Ioutn flowing to the output transistors MP10 and MN10, and the waveforms of the varying bias currents Ipd and Ind, in order from above. FIG. 7 is a waveform diagram illustrating the output signal (Vout) of the differential amplifier circuit shown in FIG. 5, and FIG. 8 is a waveform diagram illustrating the signal (Vout_Far) at the far end of the display panel 2. In FIGS. 7 and 8, the horizontal axis is the time, and the vertical axis represents the waveform of the signal (Vout_Far) at the far end of the output signal (Vout). The solid lines are waveforms in the operation of the differential amplifier circuit (source amplifier circuit 4) shown in FIG. 5, and the broken lines are waveforms of the differential amplifier circuit of a comparative example to which the varying bias sources MP20 and MN20 are not added.

In time t1, in case that the output voltage Vout rises with a rise in the input voltage Vin, the gate voltages Vpon and Vnon of the output stage turn on MP10 and turn off MN10 through feedback control from Vout to the other input terminal of Vin. In order to charge the load (see FIG. 3) that is connected to the output terminal Sout, an output current Ioutp flows. Since the gate voltage Vpon of the output stage is also input to the varying bias source MP20 of the differential stage, MP20 is also turned on and Ipd flows similarly to MP10, and thus the bias current flowing to the differential input transistors MP2 and MP3 is increased from Ibp to Ibp+Ipd. MN4 and MN5 which are current portions of the intermediate stage are speeded up in association therewith, and the output transistor MN10 is turned off at high speed by steeply dropping the Vnon potential. On the other hand, the varying bias source MN20 of the differential stage is turned off at high speed similarly to MN10, and the bias current flowing to the differential input transistors MN2 and MN3 is reduced and is changed to only Ibn. In association therewith, the gate voltage Vpon of the output stage drops steeply and turns on MP10 at high speed. Thereby, as shown in FIG. 7, Vout rises more steeply than in the comparative example in which the varying bias source shown by a broken line is not added. Similarly, the voltage Vout_Far at the far end shown in FIG. 8 also rises more steeply than in the comparative example in which the varying bias source shown by a broken line is not added.

In time t2, in case that the output voltage Vout falls with a fall in the input voltage Vin, the gate voltages Vpon and Vnon of the output stage turn off MP10 and turn on MN10. In order to discharge the load (see FIG. 3) that is connected to the output terminal Sout, the output current Ioutn flows. Since the gate voltage Vnon of the output stage is also input to the varying bias source MN20 of the differential stage, MN20 is also turned on and Ind flows similarly to MN10, and thus the bias current flowing to the differential input transistors MN2 and MN3 is increased from Ibn to Ibn+Ind. MP4 and MP5 which are current portions of the intermediate stage are speeded up in association therewith, the output transistor MP10 is turned off at high speed by steeply raising a Vpon potential. On the other hand, the varying bias source MP20 of the differential stage is turned off at high speed similarly to MP10, and the bias current flowing to the differential input transistors MP2 and MP3 is reduced and is changed to only Ibp. In association therewith, the gate voltage Vnon of the output stage rises steeply and turns on MN10 at high speed. Thereby, as shown in FIG. 7, Vout falls more steeply than in the comparative example in which the varying bias source shown by a broken line is not added. Similarly, the voltage Vout_Far at the far end shown in FIG. 8 also falls more steeply than in the comparative example in which the varying bias source shown by a broken line is not added.

The size of MP20 and MN20 is set to 1/N of MP10 and MN10 as described above, and the value of N is set so that the current value of MP20 and MN20 becomes extremely small in case that the voltage Vout is stabilized.

FIGS. 7 and 8 show waveforms in case that the display panel is taken by way of example, but FIG. 7 is an example in case that the load is light, and FIG. 8 is an example in case that the load is heavy, which are all generalized.

As described above, in the differential amplifier (source amplifier) 4 of the invention, control for increasing a bias in order to improve a slew rate during high-speed drive can be realized by self-control for feeding back an internal signal of the differential amplifier (source amplifier) 4. In addition, since bias control based on a charge and discharge current during high-speed drive is performed, it is possible to perform bias adjustment based on a source output even during high-speed drive. That is, in case that a great fluctuation in the output voltage Vout occurs, the peak of Ioutp or Ioutn which is a charge and discharge current is large, and the charge and discharge time is long, the values of the varying bias currents Ipd and Ind also become larger accordingly and the time to be added becomes longer as well. On the contrary, in case that a small fluctuation in the output voltage Vout occurs, the peak of Ioutp or Ioutn which is a charge and discharge current is small and the charge and discharge time is short. Accordingly, the values of the varying bias currents Ipd and Ind also become smaller and the time to be added becomes shorter as well. In this manner, in the differential amplifier circuit (source amplifier) 4 capable of improving a slew rate temporarily, a timing at which the slew rate is improved can be appropriately controlled in accordance with the transition of the differential signal Vin to be input. Further, it is possible to increase (Ibp+Ipd, Ibn+Ind) the bias currents of the differential pair transistors MP2 and MP3 and the differential pair transistors MN2 and MN3, at the same timing as that of the charge and discharge current for the output transistors MP10 and MN10 to charge and discharge the load and with the magnitude substantially proportional thereto, and to appropriately control not only a timing at which the slew rate is improved but also the magnitude thereof, in accordance with the transition of the output voltage (Vout).

The differential amplifier circuit (source amplifier) 4 shown in FIG. 5 is a circuit of which the differential stage includes both the bias current sources MP1 and MP20 of a high-potential-side power supply (for example, power supply VDD) and the bias current sources MN1 and MN20 of a low-potential-side power supply (for example, ground GND), but a differential amplifier circuit having a differential stage including only one of them also exhibits the same operational effect.

Figure 9:
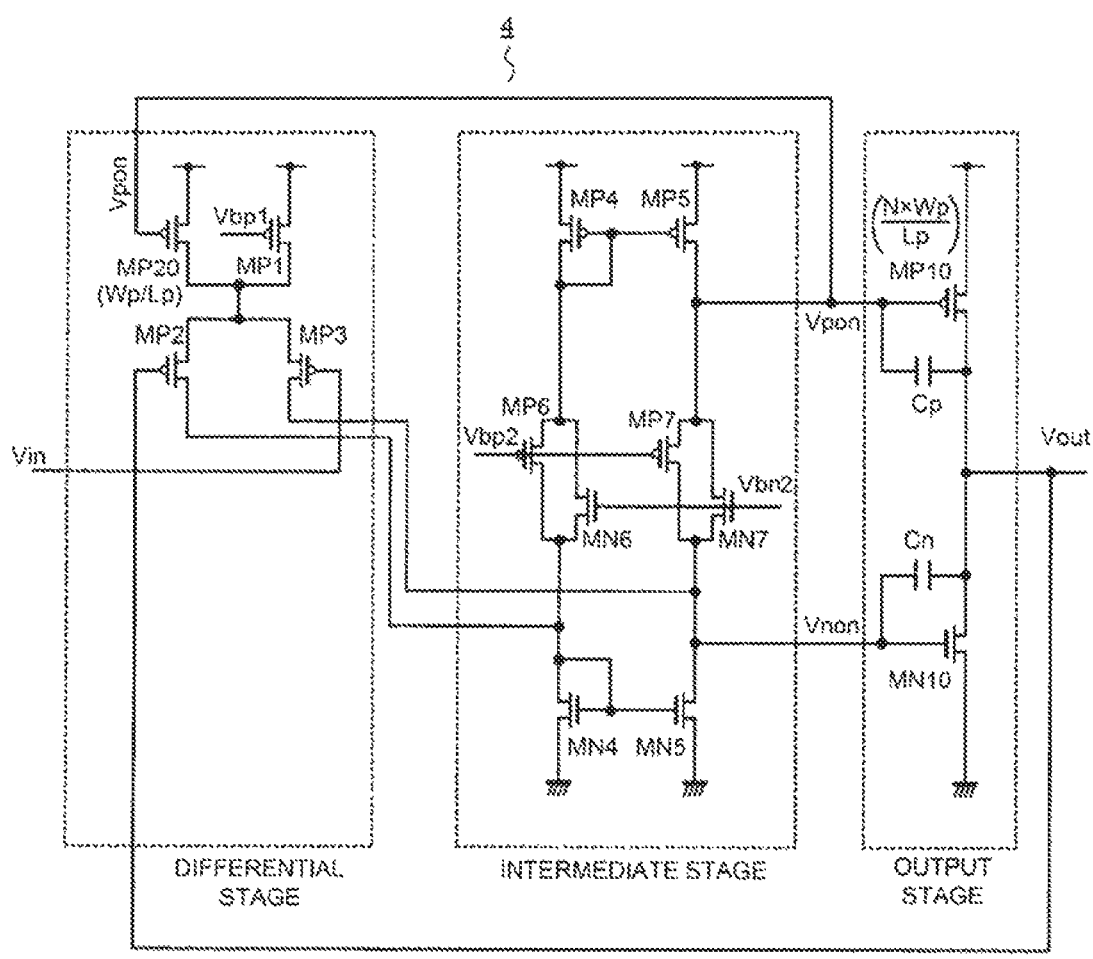
FIG. 9 is a circuit diagram illustrating a first modification example of the differential amplifier circuit according to the invention.

FIG. 9 is a circuit diagram illustrating a first modification example of the differential amplifier circuit according to the invention. As compared with the differential amplifier circuit (source amplifier) 4 shown in FIG. 5, the N-channel MOS transistors MN1, MN2, MN3, and MN20 of the differential stage are omitted, Vin is input to the gate terminal of MP3, and Vout is fed back to the gate terminal of MP2. Other circuits are the same as those in FIG. 5, and thus the description thereof will not be given.

In the operation of the differential source amplifier 4 shown in FIG. 9, in case that the output voltage Vout rises with a rise in the input voltage Vin, a current flowing to the differential input transistors MP2 and MP3 is increased from Ibp to Ibp+Ipd similarly to the operation of rise in time t1 of the differential amplifier circuit (source amplifier) 4 shown in FIG. 5 as described with reference to FIGS. 6 to 8. In association therewith, MN4 and MN5 which are current portions of the intermediate stage are speeded up, and the output transistor MN10 is turned off at high speed by steeply dropping a Vnon potential. The gate voltage Vpon of the output stage drops and turns on MP10, similarly to the comparative example. Thereby, the output voltage Vout and the voltage Vout_Far at the far end shown in FIGS. 7 and 8 rise more steeply than in the comparative example in which the varying bias source shown by a broken line is not added. On the other hand, during a fall in time t2, the slew rate is not able to be improved, and the output voltage Vout and the voltage Vout_Far at the far end shown in FIGS. 7 and 8 have the same waveform as that in the comparative example in which the varying bias source shown by a broken line is not added.

Figure 10:
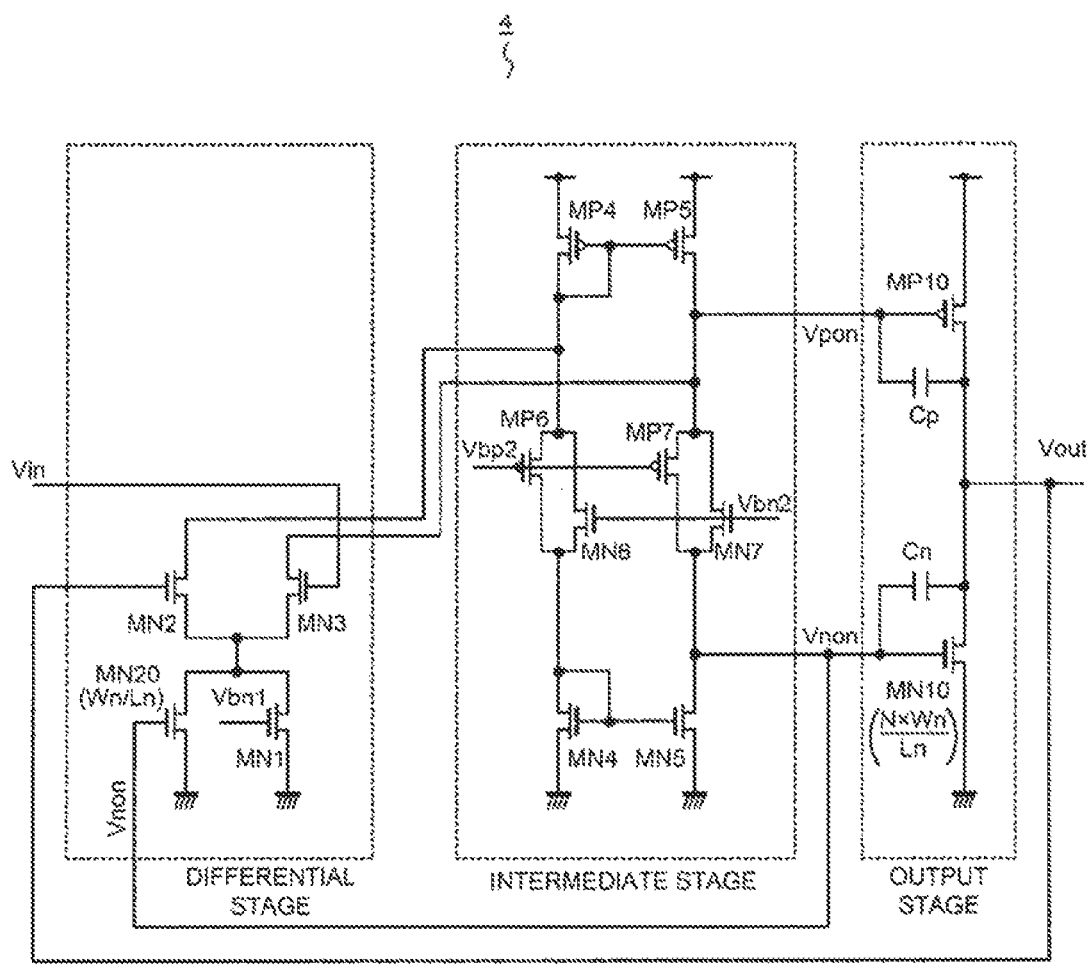
FIG. 10 is a circuit diagram illustrating a second modification example of the differential amplifier circuit according to the invention.

FIG. 10 is a circuit diagram illustrating a second modification example of the differential amplifier circuit according to the invention. As compared with the differential amplifier circuit (source amplifier) 4 shown in FIG. 5, the P-channel MOS transistors MP1, MP2, MP3, and MP20 of the differential stage are omitted, Vin is input to the gate terminal of MN3, and Vout is fed back to the gate terminal of MN2. Other circuits are the same as those in FIG. 5, and thus the description thereof will not be given.

In the operation of the differential source amplifier 4 shown in FIG. 10, in case that the output voltage Vout falls with a fall in the input voltage Vin, a current flowing to the differential input transistors MN2 and MN3 is increased from Ibn to Ibn+Ind similarly to the operation of fall in time t2 of the differential amplifier circuit (source amplifier) 4 shown in FIG. 5 as described with reference to FIGS. 6 to 8. In association therewith, MP4 and MP5 which are current portions of the intermediate stage are speeded up, and the output transistor MP10 is turned off at high speed by steeply dropping a Vpon potential. The gate voltage Vnon of the output stage drops and turns on MN10, similarly to the comparative example. Thereby, the output voltage Vout and the voltage Vout_Far at the far end shown in FIGS. 7 and 8 fall more steeply than in the comparative example in which the varying bias source shown by a broken line is not added. On the other hand, during a rise in time t1, the slew rate is not able to be improved, and the output voltage Vout and the voltage Vout_Far at the far end shown in FIGS. 7 and 8 have the same waveform as that in the comparative example in which the varying bias source shown by a broken line is not added.

FIGS. 9 and 10 are modification examples of the differential amplifier circuit according to the invention, and show a circuit having a small amount of change from the circuit shown in FIG. 5 for the purpose of understanding, but the invention is not limited thereto, and various changes and modifications may be made without departing from the scope of the invention.

Second Embodiment

Figure 11:
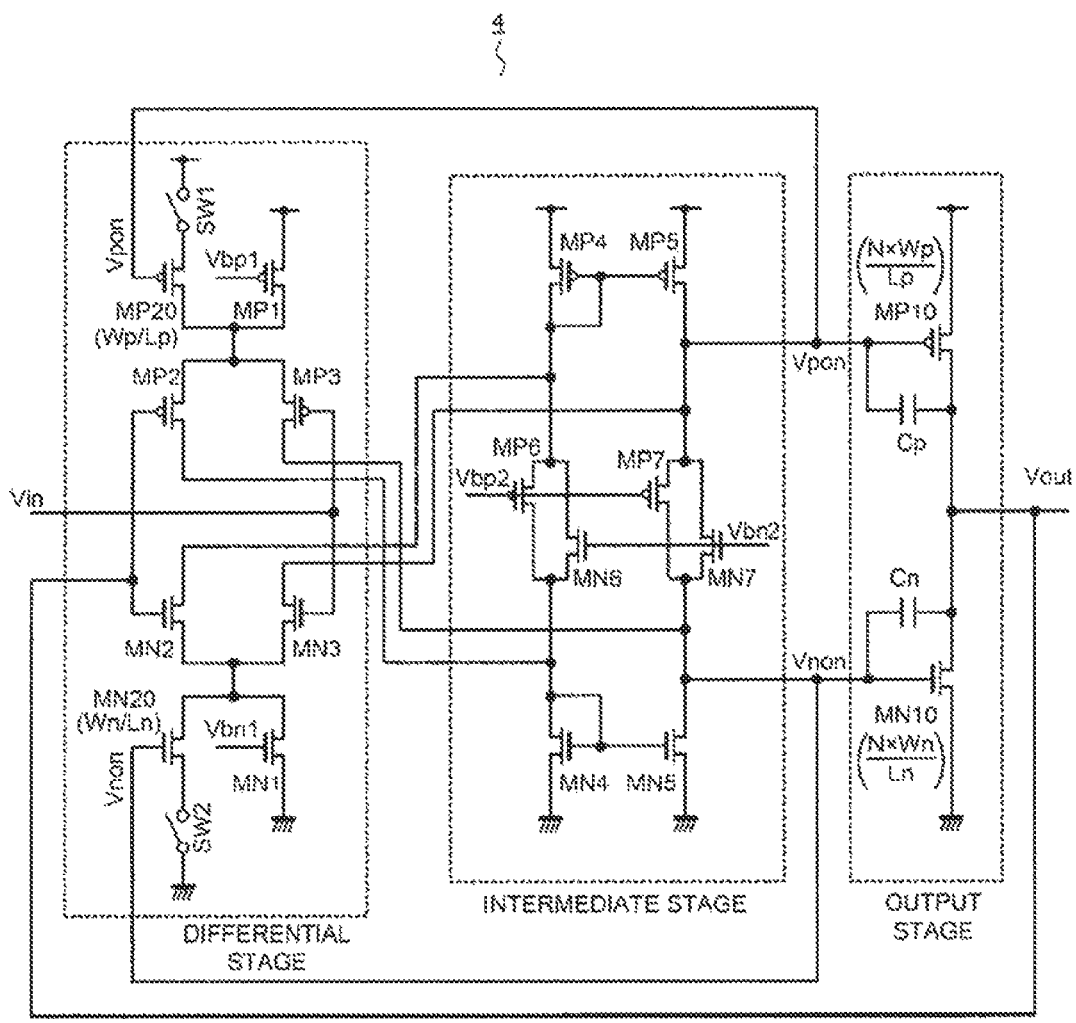
FIG. 11 is a circuit diagram illustrating a configuration example of a source amplifier based on a differential amplifier circuit of a second embodiment.

FIG. 11 is a circuit diagram illustrating a configuration example of a source amplifier circuit 4 based on a differential amplifier circuit of a second embodiment. The difference from the configuration example of the differential amplifier circuit (source amplifier) 4 of the first embodiment shown in FIG. 5 is that switches SW1 and SW2 are respectively inserted in series into MP20 and MN20 functioning as varying bias sources. That is, the switch SW1 is inserted between MP20 and a high-potential-side power supply (for example, VDD), and the switch SW2 is inserted between MN20 and a low-potential-side power supply (for example, GND). Other configurations are the same as those in FIG. 5, and thus the description thereof will not be given.

Figure 12:
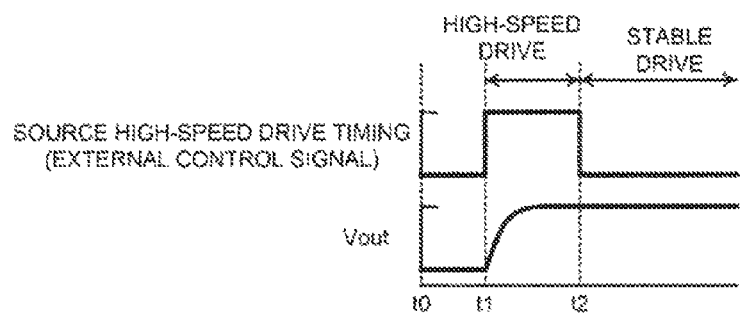
FIG. 12 is a timing diagram illustrating an operation example of the differential amplifier circuit shown in FIG. 11.

FIG. 12 is a timing diagram illustrating an operation example of the differential amplifier circuit (source amplifier) 4 shown in FIG. 11. The horizontal axis is the time, and the vertical axis direction schematically represents a source high-speed drive timing signal which is an external control signal and the output voltage Vout, in order from above. Vpon and Vnon are respectively fed back to the gate terminals of the MP20 and MN20, and the varying bias source is self-controlled similarly to the first embodiment. The source high-speed drive timing signal is input to SW1 and SW2, SW1 and SW2 are turned on in a high-speed drive period of time t1 to time t2 in which the output Vout transitions, and a slew rate is improved by increasing a bias current in synchronization with the charge and discharge operation of the output transistors MP10 and MN10. Turn-off is performed after time t2 (stable drive period) in which the level of Vout is stable. Thereby, a micro-current of the varying bias source can also be completely turned off, and a consumption current during stable drive can be kept to the same level as that of the differential amplifier circuit of the comparative example in which the varying bias source is not added. Even in case that the micro-current of the varying bias source per source amplifier circuit 4 is small in the application of this differential amplifier circuit 4 to a large number of source amplifier circuits 4_1 to 4_n in the display drive circuit 1, the effect of suppressing a consumption current during stable drive is large in case that the number of source amplifiers n extends to more than 1,000. In addition, in case of the application to the display drive circuit 1, the source high-speed drive timing signal can be generated from, for example, a strobe signal indicating a display timing or a horizontal synchronizing signal Hsync.

Third Embodiment

Figure 13:
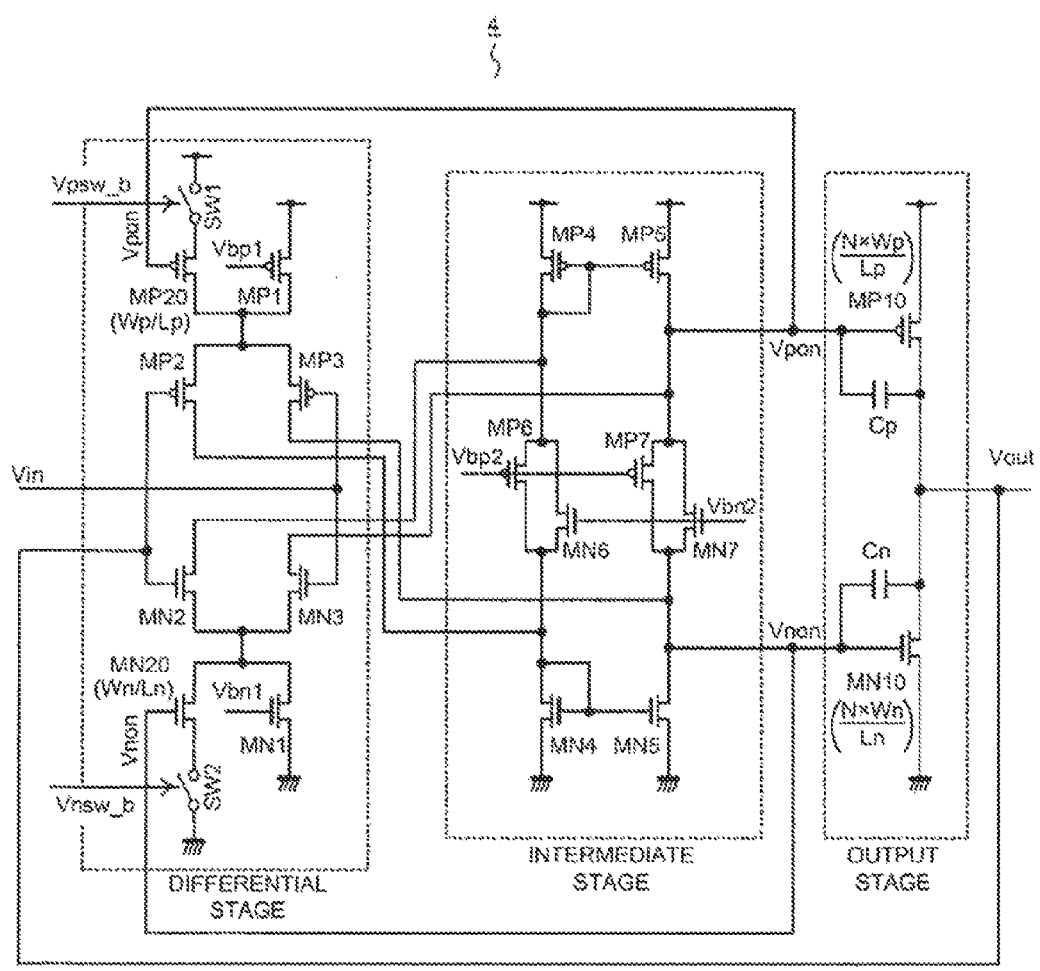
FIG. 13 is a circuit diagram illustrating a configuration example of a source amplifier based on a differential amplifier circuit of a third embodiment.

FIG. 13 is a circuit diagram illustrating a configuration example of a source amplifier circuit 4 based on a differential amplifier circuit of a third embodiment. The point that the switches SW1 and SW2 are respectively inserted in series into MP20 and MN20 functioning as varying bias sources in the differential stage is the same as in the differential amplifier circuit (source amplifier) 4 of the second embodiment shown in FIG. 11. In the third embodiment, source high-speed drive timing signals Vpsw_b and Vnsw_b for controlling the on/off state of the switches SW1 and SW2 are internally generated on the basis of Vpon and Vnon, instead of being supplied from the outside of the differential amplifier circuit (source amplifier) 4. Other circuits are the same as the differential amplifier circuit (source amplifier) 4 of the second embodiment shown in FIG. 11, and thus the description thereof will not be given.

Figure 14:
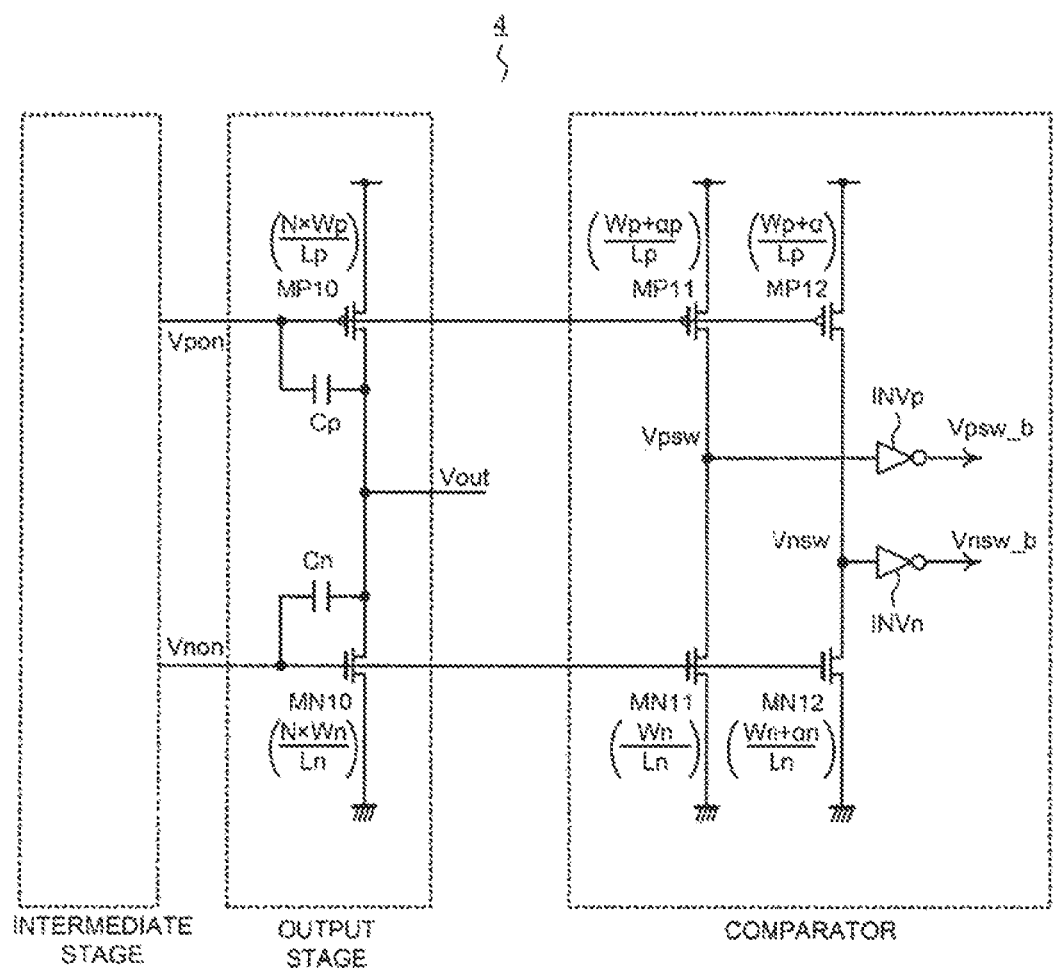
FIG. 14 is a circuit diagram illustrating a circuit that internally generates a control signal in the differential amplifier circuit of the third embodiment.

FIG. 14 is a circuit diagram illustrating a circuit that internally generates control signals Vpsw_b and Vnsw_b in the differential amplifier circuit of the third embodiment. A comparator is provided in parallel to the output stage. The comparator is configured to include two P-channel MOS transistors MP11 and MP12, two N-channel MOS transistors MN11 and MN12, and two inverters INVp and INVn. MP11 and MP12 are configured such that Vpon is input to the gate terminal similarly to MP10 of the output stage, and that the source terminal is connected to the high-potential-side power supply (for example, VDD). MN11 and MN12 are configured such that Vnon is input to the gate terminal similarly to MN10 of the output stage, and that the source terminal is connected to the low-potential-side power supply (for example, GND). Vpsw is output by the drains of MP11 and MN11 being connected to each other, and Vpsw_b for controlling SW2 is output through the inversion thereof by the inverter INVp. Vnsw is output by the drains of MP12 and MN12 being connected to each other, and Vnsw_b for controlling SW1 is output through the inversion thereof by the inverter INVn. The sizes (gate widths/gate lengths) of MP11 and MP12 are set to $(Wp+\alpha p)/Lp$ and $Wp/Lp$, respectively, with respect to the size (gate width/gate length) $N \times Wp/Lp$ of MP10. The sizes (gate widths/gate lengths) of MN11 and MN12 are set to $Wn/Ln$ and $(Wn+\alpha n)/Ln$, respectively, with respect to the size (gate width/gate length) $N \times Wn/Ln$ of MN10. A comparator based on MP11 and MN11 and a comparator based on MP12 and MN12 have offsets in a reverse direction, respectively, with respect to the output stage based on MP10 and MN10, and the relations of Vpsw=High and Vnsw=Low are established during stable drive.

FIG. 15 is a timing diagram illustrating an operation example of the differential amplifier circuit (source amplifier) 4 shown in FIG. 14. The horizontal axis is the time, and the vertical axis direction represents waveforms of Vout, Vpsw, Vnsw, Vpsw_b, and Vnsw_b, in order from above. The figure shows that SW1 is constituted by a P-channel MOS transistor and is turned on in case that the relation of Vsnw_b=Low is established, and that SW2 is constituted by an N-channel MOS transistor and is turned on in case that the relation of Vpnwb=High is established. In a rise in Vout, self-control for turning on SW2 by the operation of the comparator based on MP12 and MN12 is performed. In a fall in Vout, self-control for turning on SW1 by the operation of the comparator based on MP11 and MN11 is performed. Vpsw, Vnsw, Vpsw_b, and Vnsw_b do not have a heavy load such as the source wiring of the display panel 2 not being connected thereto unlike Vout, and thus operate at high speed.

The comparator based on MP12 and MN12 has the aforementioned offset. Therefore, Vnsw=Low is output in a period in which Vout at time t0 to time t1 has a relatively low voltage and is stabilized, Vnsw=High is output in the point of time (time t1) in which Vout starts to rise and then rises to a predetermined voltage or more which is specified by an offset, and Vnsw_b which is the inversion signal falls to Low and turns on SW1. Thereafter, Vnsw=Low is output in the point of time (time t2) in which it is detected that Vout reaches a lower voltage by a predetermined voltage which is specified by an offset than a stable voltage, and Vnsw_b which is the inversion signal rises to High and turns off SW1. In the meantime, the comparator based on MP11 and MN11 outputs Vpsw=High previously in a stable drive period at time t0 to time t1, and thus does not perform an operation responding to a rise in Vout. The comparator based on MP11 and MN11 has the aforementioned offset, outputs Vpsw=High in a period in which Vout at time t0 to time t3 rises and is stabilized at a relatively high voltage, and outputs Vpsw=Low in the point of time (time t3) in which Vout starts to drop and then drops to a predetermined voltage which is specified by an offset, and Vpsw_b which is the inversion signal rises to High and turns on SW2. Thereafter, Vpsw=High is output in the point of time (time t4) in which it is detected that Vout reaches a higher voltage by a predetermined voltage which is specified by an offset than a stable voltage, and Vpsw_b which is the inversion signal falls to Low and turns off SW2. In the meantime, the comparator based on MP12 and MN12 outputs Vnsw=Low previously in a stable drive period at time t2 to time t3, and thus does not perform an operation responding to a fall in Vout.

Thereby, a timing at which the output voltage Vout from the output terminal transitions and a stable timing are generated from an internal signal of the differential amplifier circuit, and thus it is possible to operate and turn off MP20 and MN20 which are varying bias sources at an appropriate timing.

As described above, while the invention devised by the inventor has been described specifically based on the embodiments thereof, the invention is not limited to the embodiments, and it goes without saying that various changes and modifications may be made without departing from the scope of the invention.

For example, the application to the source amplifier that drives a liquid crystal display panel has been mainly described, but a change can also be made so as to be capable of being applied to a circuit that drives other loads.

What is claimed is:
1. A differential amplifier circuit comprising:
a differential pair transistor configured to receive a differential input signal;
a current source which is connected in series to the differential pair transistor; and
an output transistor configured to drive an output terminal on the basis of the differential input signal,
wherein the output transistor is operational to increase an absolute value of a current value of the current source on the basis of a timing at which a voltage level of the output terminal is caused to transition;
wherein the output transistor is a first MOS transistor, the current source is constituted by a constant current source, and a switch and a second MOS transistor which are connected in parallel to the constant current source and are connected in series to each other, and
wherein the absolute value of the current value of the current source is increased by controlling a gate terminal of the second MOS transistor using a signal which is input to a gate terminal of the first MOS transistor.
2. The differential amplifier circuit according to claim 1, wherein the output transistor is a first MOS transistor, the current source is configured by connecting a constant current source and a second MOS transistor in parallel, and the absolute value of the current value of the current source is increased by controlling a gate terminal of the second MOS transistor using a signal which is input to a gate terminal of the first MOS transistor.

3. The differential amplifier circuit according to claim 1, wherein the switch is turned off on the basis of the signal which is input to the gate terminal of the first MOS transistor.

4. The differential amplifier circuit according to claim 1, wherein the differential amplifier circuit constitutes a voltage follower amplifier of a display drive circuit, as a source amplifier configured to drive a source electrode of a display panel.

5. The differential amplifier circuit according to claim 4, wherein the display drive circuit is formed on a single semiconductor substrate.

6. A differential amplifier circuit comprising:
a differential pair transistor configured to receive a differential input signal;
a current source which is connected in series to the differential pair transistor; and
an output transistor configured to drive an output terminal,
wherein the output transistor is constituted by a first P-channel MOS transistor which is connected between a high-potential-side power supply and the output terminal and a first N-channel MOS transistor which is connected between a low-potential-side power supply and the output terminal,
the differential pair transistor is constituted by a third P-channel MOS transistor and a third N-channel MOS transistor in which a gate terminal is configured to receive one differential input signal, and a fourth P-channel MOS transistor and a fourth N-channel MOS transistor in which a gate terminal is configured to receive one differential input signal,
the current source is configured such that a high-potential-side constant current source that supplies a positive current from the high-potential-side power supply and a second P-channel MOS transistor are connected in parallel to each other, and that a low-potential-side constant current source that supplies a negative current from the low-potential-side power supply and a second N-channel MOS transistor are connected in parallel to each other, supplies the positive current from the high-potential-side power supply to source terminals of the third P-channel MOS transistor and the fourth P-channel MOS transistor, and supplies the negative current from the negative-potential-side power supply to source terminals of the third P-channel MOS transistor and the fourth P-channel MOS transistor, and
the positive current which is supplied from the high-potential-side power supply is increased by controlling a gate terminal of the second P-channel MOS transistor using a signal which is input to a gate terminal of the first P-channel MOS transistor, and an absolute value of the negative current which is supplied from the low-potential-side power supply is increased by controlling a gate terminal of the second N-channel MOS transistor using a signal which is input to a gate terminal of the first N-channel MOS transistor.

7. The differential amplifier circuit according to claim 6, wherein a trans-conductance ratio between the first P-channel MOS transistor and the second P-channel MOS transistor and a trans-conductance ratio between the first N-channel MOS transistor and the second N-channel MOS transistor are equal to each other.

8. The differential amplifier circuit according to claim 7, wherein gate lengths of the first P-channel MOS transistor and the second P-channel MOS transistor, and gate lengths of the first N-channel MOS transistor and the second N-channel MOS transistor are respectively equal to each other, and a ratio between gate widths of the first P-channel MOS transistor and the second P-channel MOS transistor, and a ratio between gate widths of the first N-channel MOS transistor and the second N-channel MOS transistor are respectively equal to the trans-conductance ratios.

9. The differential amplifier circuit according to claim 6, further comprising a first switch in series with the second P-channel MOS transistor and a second switch in series with the second N-channel MOS transistor.

10. The differential amplifier circuit according to claim 9, wherein control for turning off the first switch and the second switch is performed on the basis of the signal which is input to each of the gate terminals of the first P-channel MOS transistor and the first N-channel MOS transistor.

11. The differential amplifier circuit according to claim 9, further comprising a switch control circuit that turns on the second switch during a transition period in which an output from the output terminal rises, and turns on the first switch during a transition period in which the output from the output terminal falls.

12. The differential amplifier circuit according to claim 11, wherein the switch control circuit includes a fifth P-channel MOS transistor which is connected between the high-potential-side power supply and a fall detection node, a fifth N-channel MOS transistor which is connected between the low-potential-side power supply and a fall detection node, a sixth P-channel MOS transistor which is connected between the high-potential-side power supply and a rise detection node, and a sixth N-channel MOS transistor which is connected between the low-potential-side power supply and the rise detection node,
a trans-conductance ratio between the fifth P-channel MOS transistor and the fifth N-channel MOS transistor is larger than a trans-conductance ratio between the first P-channel MOS transistor and the first N-channel MOS transistor, and
a trans-conductance ratio between the sixth P-channel MOS transistor and the sixth N-channel MOS transistor is smaller than a trans-conductance ratio between the first P-channel MOS transistor and the first N-channel MOS transistor.

13. A display drive circuit comprising a voltage follower amplifier which is constituted by the differential amplifier circuit according to claim 6, as a source amplifier configured to drive a source electrode of a display panel.

14. The display drive circuit according to claim 13, wherein the display drive circuit is formed on a single semiconductor substrate.

* * * * *